United States Patent
Gu et al.

(10) Patent No.: US 12,033,712 B2
(45) Date of Patent: Jul. 9, 2024

(54) CHIP TEST METHOD AND APPARATUS, COMPUTER DEVICE, AND READABLE STORAGE MEDIUM THEREOF

(71) Applicant: CHANGXIN MEMORY TECHNOLOGIES, INC., Hefei (CN)

(72) Inventors: Yinchuan Gu, Hefei (CN); Yadong Ye, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 183 days.

(21) Appl. No.: 17/810,898

(22) Filed: Jul. 6, 2022

(65) Prior Publication Data

US 2023/0317199 A1 Oct. 5, 2023

(30) Foreign Application Priority Data

Apr. 1, 2022 (CN) .......................... 202210338251.5

(51) Int. Cl.
*G01R 31/26* (2020.01)
*G11C 29/50* (2006.01)

(52) U.S. Cl.
CPC ............... *G11C 29/50004* (2013.01); *G11C 2029/5004* (2013.01)

(58) Field of Classification Search
CPC ............ G01R 31/2893; G01R 31/3172; G01R 31/31701; G01R 31/31703; G01R 31/31713; G01R 31/31722
See application file for complete search history.

(56) References Cited

U.S. PATENT DOCUMENTS

| | | | | |
|---|---|---|---|---|
| 8,872,551 | B2 * | 10/2014 | Choi | ........................ H03K 5/22 327/158 |
| 11,353,509 | B2 * | 6/2022 | Mao | ................ G01R 31/31908 |
| 2009/0315582 | A1 * | 12/2009 | Agatsuma | ...... G01R 31/318544 324/750.3 |
| 2013/0271107 | A1 * | 10/2013 | Grossier | ................... G05F 1/10 323/349 |
| 2021/0208196 | A1 * | 7/2021 | Ning | ................ G11C 29/56012 |

FOREIGN PATENT DOCUMENTS

CN 110827911 B 5/2021

* cited by examiner

*Primary Examiner* — Thang X Le
(74) *Attorney, Agent, or Firm* — Kilpatrick Townsend & Stockton LLP

(57) ABSTRACT

The present application relates to a chip test method and apparatus, a computer device, and a readable storage medium thereof. The chip test method includes: applying a test signal to a to-be-tested chip; and sending a data signal to the to-be-tested chip such that the to-be-tested chip enters a test mode based on the test signal and the data signal, and regulating a test voltage of the to-be-tested chip.

11 Claims, 4 Drawing Sheets

S231
Send a data strobe signal to the to-be-tested chip

S232
After the preset latch time after receiving the data signal, trigger, by using the data strobe signal, the data signal to be valid S233
Regulate the test voltage of the to-be-tested chip according to a test instruction carried in the test signal

CHIP TEST METHOD AND APPARATUS, COMPUTER DEVICE, AND READABLE STORAGE MEDIUM THEREOF

CROSS-REFERENCE TO RELATED APPLICATION

This application claims the priority of Chinese Patent Application No. 202210338251.5, submitted to the Chinese Intellectual Property Office on Apr. 1, 2022, the disclosure of which is incorporated herein in its entirety by reference.

BACKGROUND

Semiconductor device testing is to measure electrical parameters of a wafer-level integrated circuit to check consistency of specifications, so as to check acceptable electrical performance. As an index of measuring an aging degree of a semiconductor device, wafer level burn-in (WLBI) plays a decisive role in reducing a cost of an aging test and obtaining a known good die (KGD) in a manufacturing process of the semiconductor device.

However, in a wafer-level aging test, a condition of each chip cannot be adjusted, which decreases a test effect.

SUMMARY

The present application relates to the technical field of semiconductors, and in particular, to a chip test method and apparatus, a computer device, and a readable storage medium thereof.

On this basis, it is necessary to provide a chip test method and apparatus, a computer device, and a readable storage medium thereof.

To implement the foregoing objective, the present application provides a chip test method, inducing:

applying a test signal to a to-be-tested chip; and
sending a data signal to the to-be-tested chip such that the to-be-tested chip enters a test mode based on the test signal and the data signal, and regulating a test voltage of the to-be-tested chip.

The present application further provides a chip test apparatus, including:

one or more processors; and
a storage apparatus, configured to store one or more programs, wherein the one or more programs, when executed by the one or more processors, cause the one or more processors to execute operations of:
applying a test signal to a to-be-tested chip;
sending a data signal to the to-be-tested chip such that the to-be-tested chip enters a test mode based on the test signal and the data signal; and
connecting to the to-be-tested chip and regulating a test voltage of the to-be-tested chip.

The present application further provides a computer-readable storage medium. The computer-readable storage medium stores a computer program, and the computer program is executed by a processor to implement the steps of the chip test method according to any one of the above embodiments.

BRIEF DESCRIPTION OF THE DRAWINGS

To describe the technical solutions in the embodiments of the present application or in the conventional art more clearly, the following briefly describes the accompanying drawings required for describing the embodiments or the conventional art. Apparently, the accompanying drawings in the following description show merely some embodiments of the present application, and a person of ordinary skill in the art may still derive other accompanying drawings from these accompanying drawings without creative efforts.

DETAILED DESCRIPTION

To facilitate the understanding of the present application, the present application will be described more completely below with reference to the related accompanying drawings. Preferred embodiments of the present application are shown in the accompanying drawings. However, the present application may be embodied in various forms without being limited to the embodiments described herein. On the contrary, these embodiments are provided to make the present application more thorough and comprehensive.

Unless otherwise defined, all technical and scientific terms used herein have the same meaning as commonly understood by those skilled in the technical field of the present application. The terms used in this specification of the present application are merely for the purpose of describing specific embodiments, rather than to limit the present application.

It should be understood that when an element is described as "being connected to" another element, it can be connected to the another element directly, or intervening elements may be present. It should also be understood that in addition to the orientations shown in the figure, the spatial relationship terms further include different orientations of used and operated devices. For example, if a device in the accompanying drawings is turned over and described as being "beneath another element", "below it", or "under it", the device or feature is oriented "on" the another element or feature. Therefore, the exemplary terms "beneath" and "under" may include two orientations of above and below. In addition, the device may further include other orientations (for example, a rotation by 90 degrees or other orientations), and the spatial description used herein is interpreted accordingly.

In this specification, the singular forms of "a", "an" and "the/this" may also include plural forms, unless clearly indicated otherwise. It should also be understood that terms "include" and/or "comprise", when used in this specification, may determine the presence of features, integers, steps, operations, elements and/or components, but do not exclude the presence or addition of one or more other features, integers, steps, operations, elements, components and/or groups. In this case, in this specification, the term "and/or" includes any and all combinations of related listed items.

In a WLBI test of a dynamic random access memory (DRAM), a power voltage of each to-be-tested chip needs to be regulated to a fixed value. In the conventional art, a same test signal is generally used to regulate test voltages of all to-be-tested chips on a same to-be-tested wafer.

Figure 1:
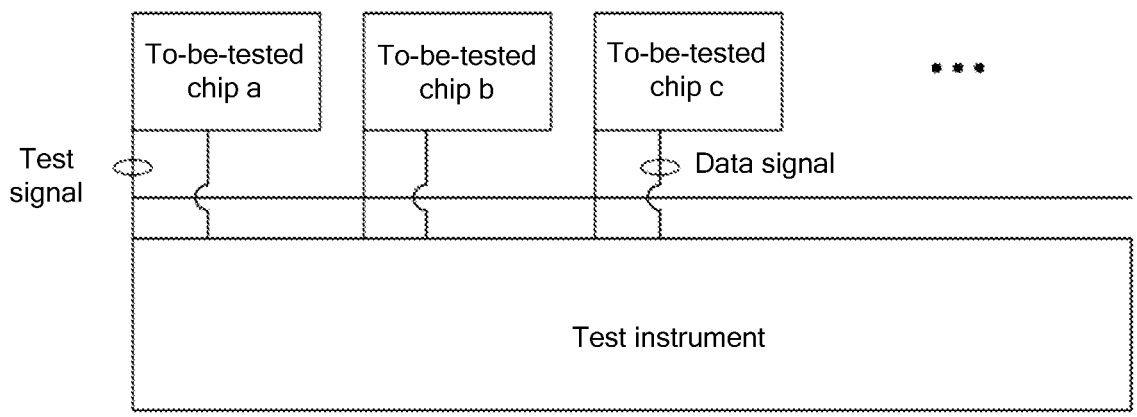
FIG. 1 is a schematic structural diagram of a chip test apparatus.

Due to different manufacturing processes, a deviation between a power voltage and a target value of each to-be-tested chip is actually different, and as a result, a test voltage value applicable for each to-be-tested chip is also different. Referring to FIG. 1, in the WLBI test, due to particularity of a connection mode, only a pin that is of each to-be-tested chip and related to a data signal is independently connected to a test instrument and can be controlled independently, other pins are shared by all to-be-tested chips. As a result, when the test instrument sends a test signal containing a test instruction and a test voltage value, all the to-be-tested chips are actually controlled, and test voltages of all the to-be-tested chips change. In this way, the test voltage of each to-be-tested chip cannot be controlled independently, reducing accuracy of test voltage regulation and affecting a test effect.

Figure 2:
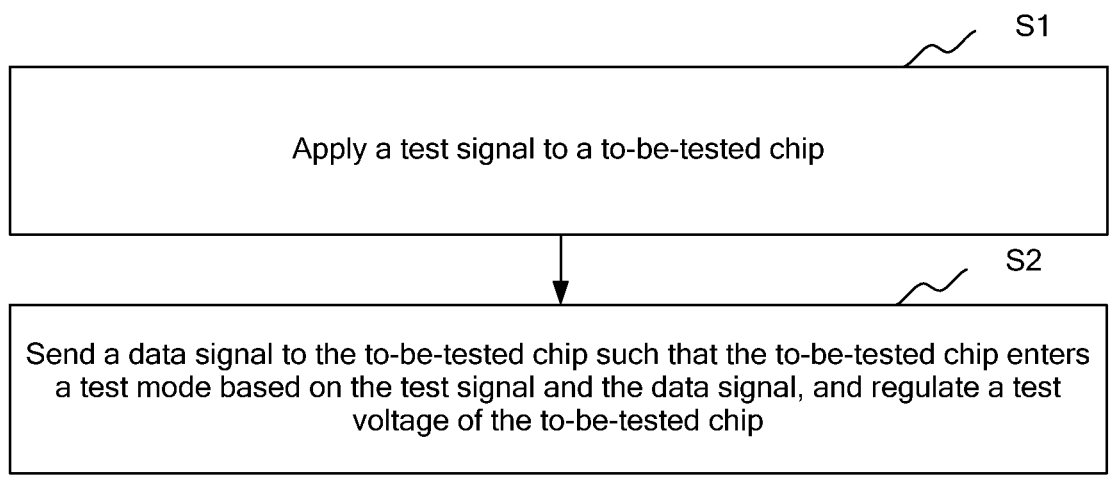
FIG. 2 is a flowchart of a chip test method according to an embodiment of the present application.

Referring to FIG. 2, based on the above problem, the present application provides a chip test method. The chip test method may specifically include the following steps:

S1: Apply a test signal to a to-be-tested chip.

S2: Send a data signal to the to-be-tested chip such that the to-be-tested chip enters a test mode based on the test signal and the data signal, and regulate a test voltage of the to-be-tested chip.

According to the chip test method, the test signal and the data signal are jointly used to control each to-be-tested chip to enter the test mode. In this way, the test mode of the to-be-tested chip can be independently controlled based on data signal information of the to-be-tested chip, so as to independently control the test voltage of the to-be-tested chip. In this way, the test voltage can be regulated more accurately and reliability of chip testing can be improved.

As an example, the to-be-tested chip may include, but is not limited to, a static random access memory (SRAM), a dynamic random access memory (DRAM), and a synchronous dynamic random access memory (SDRAM).

The present application does not specifically limit a structure of the to-be-tested chip. In an embodiment, the to-be-tested chip is provided with a test pin and a data pin; and the to-be-tested chip can receive the test signal by using the test pin and receive the data signal by using the data pin.

As used in the present application, the term "data pin" or "test pin" is a pin that is of the to-be-tested chip and defined based on a specification of the to-be-tested chip for exchanging the data signal or the test signal.

It should be understood that the to-be-tested chip may be provided with a plurality of test pins and a plurality of data pins. Any test pin may be adaptively selected to receive the test signal based on an actual work requirement. Similarly, any data pin may be adaptively selected to receive the data signal based on an actual work requirement.

It should also be understood that the test pin may include a pin dedicated to performing a debugging operation (for example, a TMSC pin or a TCKC pin), or a key pin such as a clock on the to-be-tested chip may be led out as a part of the test pin.

In an embodiment, a plurality of to-be-tested chips are located on a same to-be-tested wafer.

Based on the above embodiment, step S1 may include: sending the test signal to the to-be-tested chips on the same to-be-tested wafer simultaneously.

Figure 3:
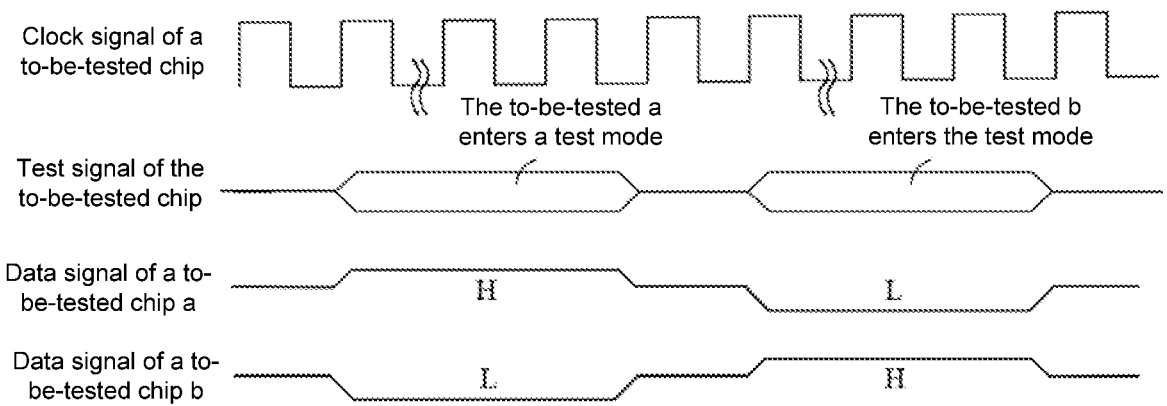
FIG. 3 is a timing diagram of using a test signal and a data signal to jointly control a to-be-tested chip to enter a test mode in a chip test method according to an embodiment of the present application.

A to-be-tested chip a and a to-be-tested chip b on the same to-be-tested wafer are taken as an example. Because test pins of the to-be-tested chips are connected to a signal sending terminal of a test instrument at the same time, the test instrument sends the test signal to the to-be-tested chips (including the to-be-tested chip a and the to-be-tested chip b) on the same to-be-tested wafer simultaneously. In the present application, the test signal and the data signal need to be used jointly to control the to-be-tested chip to enter the test mode, as shown in FIG. 3. Therefore, the test signal can be truly recognized and enabled by the to-be-tested chip a or the to-be-tested chip b only when a data signal of the to-be-tested chip a or the to-be-tested chip b is also at a high level. In this example, if it is necessary to regulate a test voltage of a to-be-tested chip, it is only necessary to pull data signals of other to-be-tested chips to a low level.

The data signal is sent to the to-be-tested chip such that the to-be-tested chip enters the test mode based on the test signal and the data signal, and the test voltage of the to-be-tested chip is regulated.

The present application does not specifically limit a manner in which the to-be-tested chip enters the test mode based on the test signal and the data signal in step S2. The following describes a method in which the to-be-tested chip enters the test mode in some possible embodiments of the present application.

In an embodiment, the to-be-tested chip may be provided with a receiving module.

Based on the above embodiment, step S2 may include: generating, by the receiving module, an internal test signal based on the test signal and the data signal, wherein the internal test signal is configured as that the to-be-tested chip can enter the test mode based on the internal test signal.

It should be noted that the present application does not specifically limit a form of the receiving module. As an example, the receiving module may include, but is not limited to, an AND gate.

In an embodiment, a first receiving terminal of the receiving module is connected to the test pin to receive the test signal sent by the test pin; a second receiving terminal of the receiving module is connected to the data pin to receive the data signal sent by the data pin; and an output terminal of the receiving module is connected to a test mode register inside the to-be-tested chip. Based on the internal test signal output by the receiving module, the test mode register configures the to-be-tested chip to enter the test mode.

An embodiment in which the receiving module includes the AND gate is described in more detail with reference to FIG. 3. In this embodiment, a trigger condition of the test mode is that the data signal is at the high level.

The AND gate may include at least a first input terminal, a second input terminal, and an output terminal. Taking the to-be-tested chip a as an example, the first input terminal of the AND gate may be configured to connect to the test signal of the to-be-tested chip, the second input terminal of the AND gate may be configured to connect to the data signal of the to-be-tested chip a, and the output terminal of the AND gate may be configured to output the internal test signal.

When the test signal is applied to the to-be-tested chip, the first input terminal of the AND gate connects to the test signal. When the data signal of the to-be-tested chip a is at the low level, the second input terminal of the AND gate is connected to the low level. In this case, the output terminal of the AND gate outputs the low level, and the to-be-tested chip a does not enter the test mode.

When the data signal of the to-be-tested chip a is at the high level, the second input terminal of the AND gate is connected to the high level instead of the low level. In this case, the to-be-tested chip a can enter the test mode.

It can be understood that in this embodiment, when the data signal is at the high level, the test mode can be triggered effectively; when the data signal is at the low level, the test mode cannot be triggered effectively. On this basis, time during which the data signal is maintained at the high level should be the same as time required by the test mode.

In an embodiment, the to-be-tested chip may be provided with the test mode register.

Figure 4:
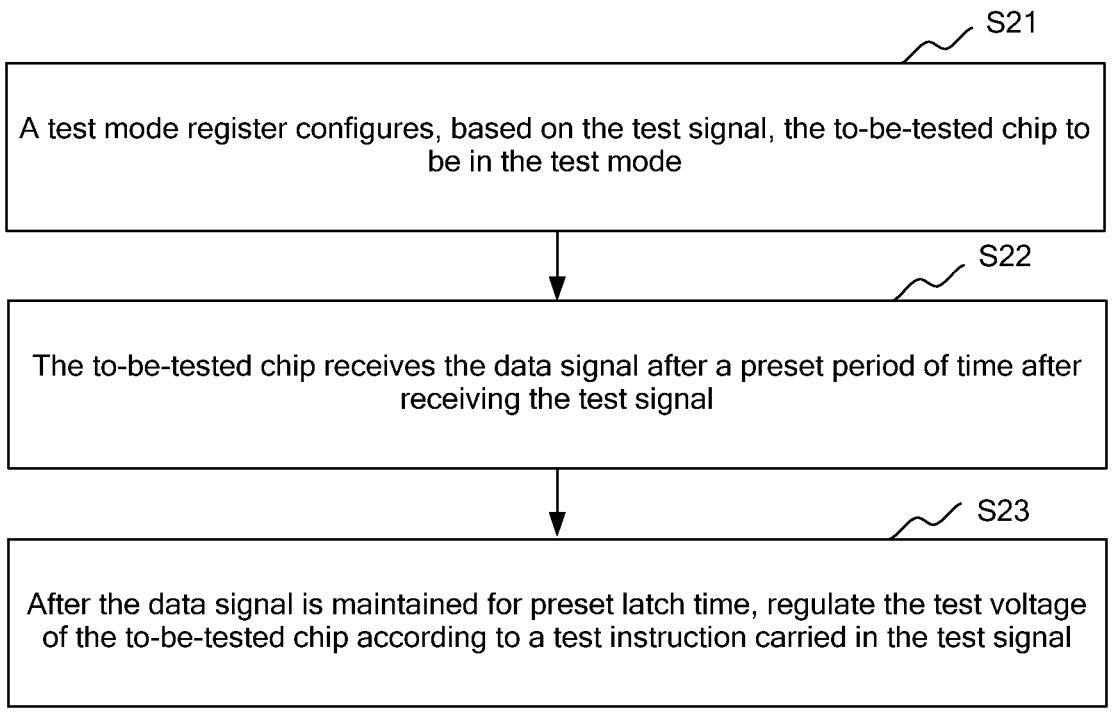
FIG. 4 is a flowchart of step S2 in a chip test method according to an embodiment of the present application.

Based on the above embodiment, referring to FIG. 4, when the to-be-tested chip is configured to be in an addressing mode, step S2 may specifically include the following substeps:

S21: The test mode register configures, based on the test signal, the to-be-tested chip to be in the test mode.

S22: The to-be-tested chip receives the data signal after a preset period of time after receiving the test signal.

S23: After the data signal is maintained for preset latch time, regulate the test voltage of the to-be-tested chip according to a test instruction carried in the test signal.

The chip test method uses the addressing mode of the to-be-tested chip to conduct a test one by one. As an example, the addressing mode involved in the present application may include a per DRAM addressability (PDA) mode.

For step S21, the present application does not specifically limit a form of the test mode register. As an example, the test mode register can generate a control signal of an internal regulation circuit of the to-be-tested chip based on a different test signal, regulate the internal regulation circuit of the to-be-tested chip based on the control signal, and output a test result. The addressing mode of the to-be-tested chip is realized by configuring an addressing mode register inside the to-be-tested chip. An addressing signal is input to the addressing mode register, such that the addressing mode register recognizes the addressing signal, and configures the to-be-tested chip to enter the PDA mode.

The to-be-tested chip includes but is not limited to a DRAM chip in a DDR4 SDRAM (DDR4 for short). The DDR4 is composed of a plurality of DRAM chips, and any DRAM chip on the DDR4 can be separately operated in the PDA mode. PDA enabling can be realized by writing the high level into an A4 bit of a mode register MR3 inside the DRAM chip.

For step S22, the present application does not specifically limit a form and a length of the preset period of time. As an example, the preset period of time may include, but is not limited to, a sum of an AL, a CL, and a PL.

For step S23, the present application does not specifically limit a form of the test instruction.

As an example, the test instruction may include, but is not limited to, a test voltage value.

Based on the above example, step S23 may include:
regulating an original voltage value of the to-be-tested chip to the test voltage value according to the test instruction carried in the test signal.

The present application does not specifically limit a size of the original voltage value. As an example, the original voltage value may be 1 V to 5 V, for example, may be 1 V, 2 V, 3 V, 4 V, or 5 V.

For example, the test instruction may be a value string that can be converted through a logic level, such as 0000, 0001, or 0010. Each test instruction represents a different target voltage value, for example, 0000 represents 0.1 V, 0001 represents 0.2 V, and 0010 represents 0.3 V. In a test process, the original voltage value of the to-be-tested chip is obtained first, which can be obtained according to another test instruction. If the original voltage value is 1 V and a target voltage value is higher than the original voltage value, a signal such as 0010 is input to continuously increase the original voltage value to the target voltage value. In a process of testing another function, the to-be-tested chip is kept to run at a corresponding target voltage, to improve test efficiency of the chip.

In an embodiment, the to-be-tested chip may further have a voltage regulation circuit, and the voltage regulation circuit may include a plurality of load elements. Based on the above embodiment, the regulating an original voltage value of the to-be-tested chip to the test voltage value according to the test instruction carried in the test signal may specifically include:

regulating, by the to-be-tested chip, a quantity of the load elements connected to the voltage regulation circuit or a regulation frequency of the voltage regulation circuit based on the test voltage value.

The present application does not specifically limit a form of the voltage regulation circuit. As an example, the voltage regulation circuit may include, but is not limited to, a power boost circuit or an on-die termination (ODT) circuit.

Figure 5:
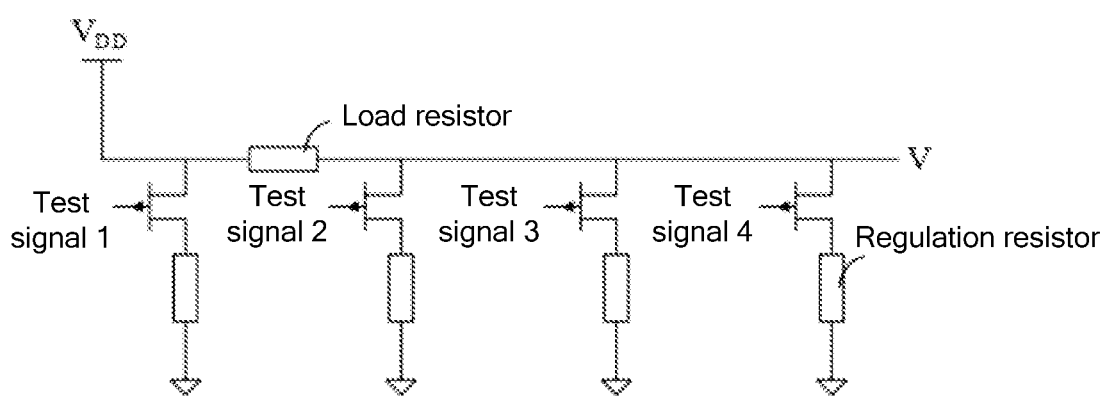
FIG. 5 is a schematic diagram of a voltage regulation circuit in a chip test method according to an embodiment of the present application.

FIG. 5 is a schematic diagram of the voltage regulation circuit according to an embodiment of the present application. In this embodiment, the load elements may include a plurality of regulation resistors connected to the voltage regulation circuit.

The voltage regulation circuit may include a plurality of regulation branches, and each regulation branch includes at least one regulation resistor and a switch transistor. A first terminal of the switch transistor is connected to the original voltage value $V_{DD}$, a second terminal of the switch transistor is connected to one terminal of the regulation resistor, and a control terminal of the switch transistor is connected to the test signal. The other terminal of the regulation resistor is grounded.

As described above, the to-be-tested chip may be provided with the plurality of test pins. In this embodiment, based on a quantity of regulation branches contained in the voltage regulation circuit, any test pins of the corresponding quantity can be selected to receive the test signal. Similarly, test signals of the corresponding quantity can be connected based on the quantity of regulation branches contained in the voltage regulation circuit. For example, as shown in FIG. 5, if the voltage regulation circuit includes four regulation branches, any four test pins can be selected to receive test signals 1, 2, 3, and 4 respectively. These test signals can be used to control on/off of corresponding switch transistors, so as to control corresponding regulation resistors to be connected to or disconnected from the voltage regulation circuit.

Figure 6:
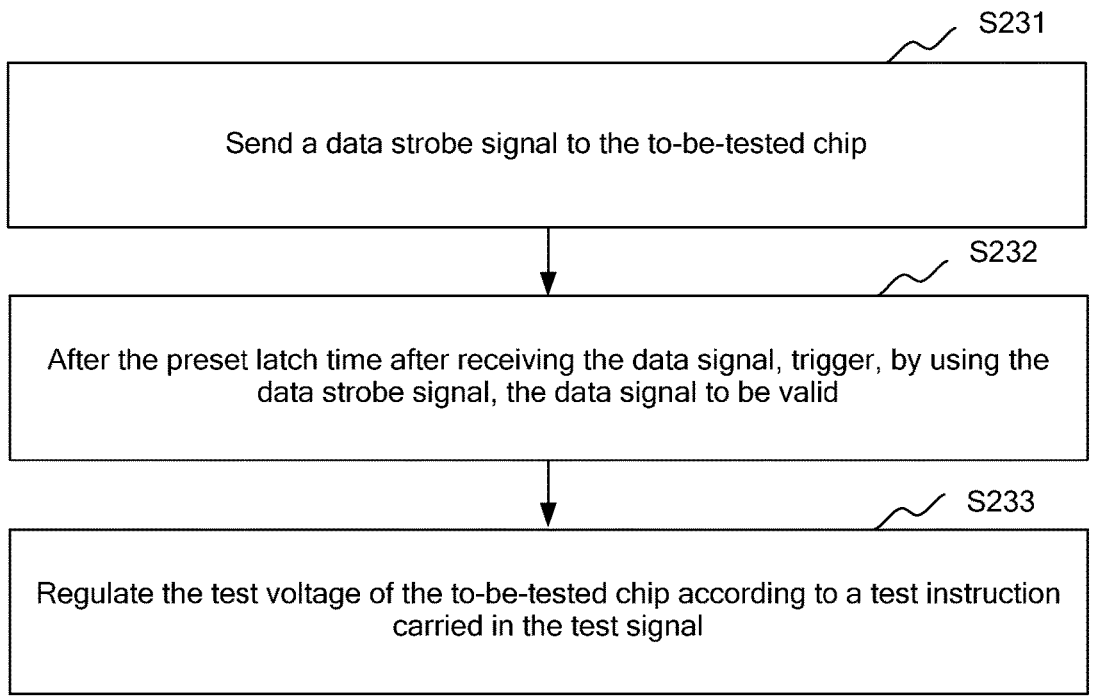
FIG. 6 is a flowchart of step S23 in a chip test method according to an embodiment of the present application.

Referring to FIG. 6, as an example, step S23 may further include the following steps:

S231: Send a data strobe signal to the to-be-tested chip.

S232: After the preset latch time after receiving the data signal, trigger, by using the data strobe signal, the data signal to be valid.

S233: Regulate the test voltage of the to-be-tested chip according to the test instruction carried in the test signal.

It should be understood that validity of all mode register set (MRS) instructions in the PDA mode is determined by the data signal DQ0, and the data signal DQ0 may be collected by using the data strobe signal DQS. The to-be-tested chip can determine, by using the data strobe signal DQS, whether to receive the read data signal DQ0 to determine whether to execute the MRS instruction. For example, if the data signal DQ collected by using the data strobe signal DQS is at the low level, namely, DQ0, the MRS instruction is executed; if the data signal DQ collected by using the data strobe signal DQS is at the high level, namely, DQ1, the MRS instruction is not executed.

Figure 7:
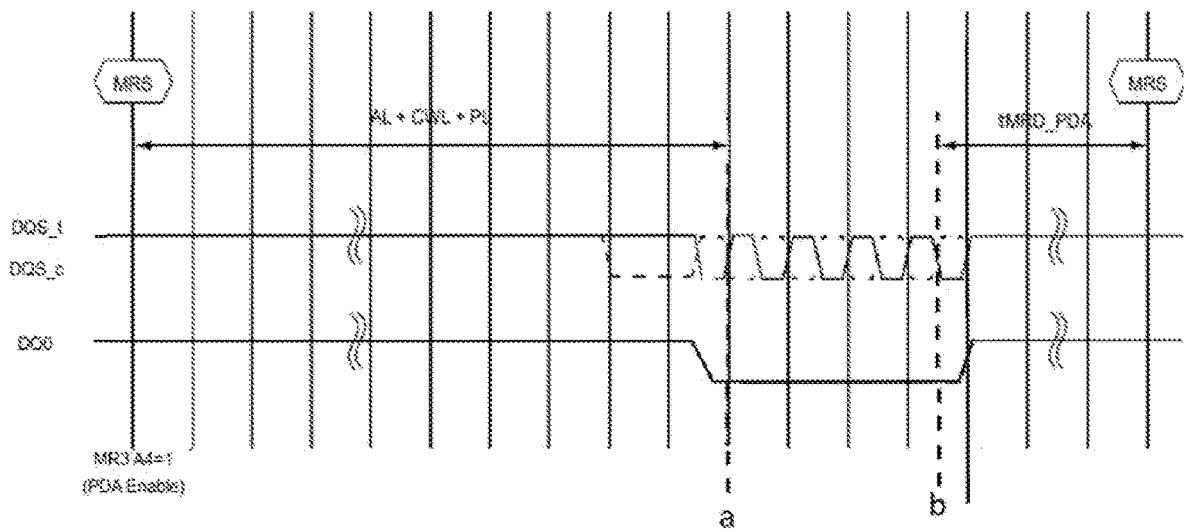
FIG. 7 is a schematic timing diagram of step S23 in a chip test method according to an embodiment of the present application.

The present application does not specifically limit a length of the preset latch time in step S232. As an example, the preset latch time may be determined based on the data strobe signal and a burst length (BL) of the to-be-tested chip. For example, the preset latch time of the data signal collected by using a rising edge and/or falling edge of the data strobe signal may be time during which the data strobe signal is transmitted for ½ of the BL. FIG. 7 is a schematic timing diagram of step S23 according to a possible embodiment. If the BL is 8, the data signal is collected at the rising edge of the data strobe signal. After a cycle of collecting four DQ0s, namely, four data strobe signals, it is determined to execute the test instruction to ensure that the instruction is accurately received and executed. It can be understood that the low level needs to be input in a period of time shown between a and b in FIG. 7, otherwise the MRS instruction cannot be executed and the configuration fails.

Figure 8:
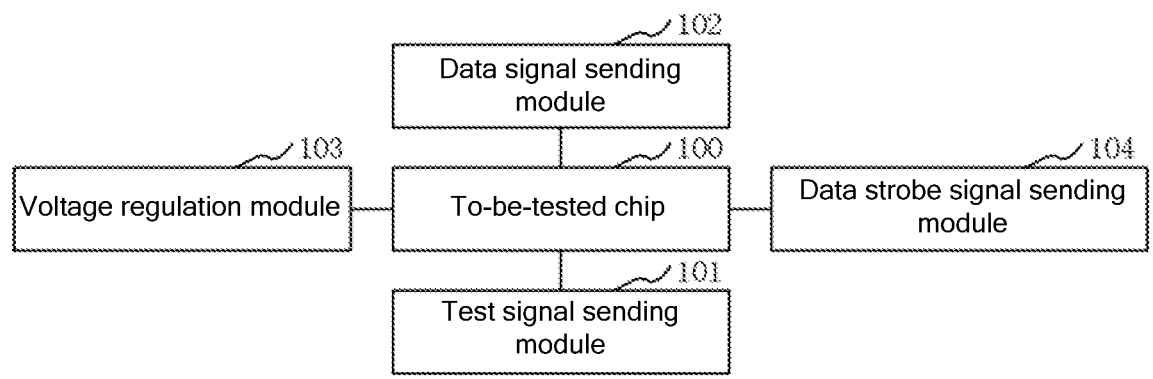
FIG. 8 is a schematic structural diagram of a chip test apparatus according to an embodiment of the present application.

According to some embodiments, the present application further provides a chip test apparatus. Referring to FIG. 8, the chip test apparatus may include a test signal sending module 101, a data signal sending module 102, and a voltage regulation module 103.

The test signal sending module 101 may be configured to send a test signal to a to-be-tested chip 100. The data signal sending module 102 may be configured to send a test signal to the to-be-tested chip 100 such that the to-be-tested chip 100 can enter a test mode based on the test signal and the data signal. The voltage regulation module 103 is connected to the to-be-tested chip 100 and may be configured to regulate a test voltage of the to-be-tested chip 100.

According to the chip test apparatus, the data signal sending module 102 can send the data signal to the to-be-tested chip 100, and the data signal and the test signal applied by the test signal sending module to the to-be-tested chip 100 are jointly used to control the to-be-tested chip 100 to enter the test mode. In this way, the test mode of the to-be-tested chip 100 can be independently controlled based on data signal information of the to-be-tested chip 100, so as to independently control the test voltage of the to-be-tested chip 100. In this way, the test voltage can be regulated more accurately and reliability of chip testing can be improved.

In an embodiment, the test signal sending module 101 may apply the test signal to the to-be-tested chip 100 by using a test pin of the to-be-tested chip 100. The data signal sending module 102 may also send the data signal to the to-be-tested chip 100 by using a data pin of the to-be-tested chip 100.

It should be noted that the to-be-tested chip may be provided with a plurality of test pins and a plurality of data pins. On this basis, the test signal sending module 101 can send the test signal to a valid test pin of the to-be-tested chip based on an actual situation of the to-be-tested chip. Similarly, the data signal sending module 102 can also send the data signal to a valid data pin of the to-be-tested chip based on an actual situation of the to-be-tested chip.

In an embodiment, the test signal sending module 101 may send the test signal to a plurality of to-be-tested chips 100 on a same to-be-tested wafer simultaneously.

A to-be-tested chip a and a to-be-tested chip b on the same to-be-tested wafer are taken as an example. Because test pins of the to-be-tested chips are connected to a signal sending terminal of the test signal sending module 101 at the same time, the test signal sending module 101 can send the test signal to the to-be-tested chips (including the to-be-tested chip a and the to-be-tested chip b) on the same to-be-tested wafer simultaneously. In the present application, the test signal and the data signal need to be used jointly to control the to-be-tested chip to enter the test mode, as shown in FIG. 3. Therefore, the test signal can be truly recognized and enabled by the to-be-tested chip a or the to-be-tested chip b only when a data signal of the to-be-tested chip a or the to-be-tested chip b is also at a high level. In this example, if it is necessary to regulate a test voltage of a to-be-tested chip, it is only necessary to pull data signals of other to-be-tested chips to a low level.

As described above, the test signal may carry a test instruction. On this basis, the voltage regulation module 103 can regulate the test voltage of the to-be-tested chip 100 according to the test instruction.

As described above, the test instruction may include a test voltage value. On this basis, the voltage regulation module 103 can regulate an original voltage value of the to-be-tested chip 100 to the test voltage value according to the test instruction carried in the test signal.

As described above, the to-be-tested chip 100 may have a voltage regulation circuit.

The voltage regulation circuit may be connected to a plurality of load elements. On this basis, the voltage regulation module 103 can control, according to the test instruction carried in the test signal, the to-be-tested chip 100 to regulate a quantity of the load elements connected to the voltage regulation circuit or a regulation frequency of the voltage regulation circuit based on the test voltage value.

Specifically, when the original voltage value of the to-be-tested chip 100 is lower than the test voltage value, the original voltage value of the to-be-tested chip 100 can be regulated to the test voltage value by reducing the load elements connected to the voltage regulation circuit or reducing the regulation frequency of the voltage regulation circuit. When the original voltage value of the to-be-tested chip 100 is higher than the test voltage value, the original voltage value of the to-be-tested chip 100 can be regulated to the test voltage value by increasing the load elements of the voltage regulation circuit or increasing the regulation frequency of the voltage regulation circuit.

Referring to FIG. 5, the load elements may include a plurality of regulation resistors connected to the voltage regulation circuit. The voltage regulation circuit includes a plurality of regulation branches, and each regulation branch includes at least one regulation resistor and a switch transistor. A first terminal of the switch transistor is connected to the original voltage value $V_{DD}$, a second terminal of the switch transistor is connected to one terminal of the regulation resistor, and a control terminal of the switch transistor is connected to the test signal. The other terminal of the regulation resistor is grounded.

As described above, the to-be-tested chip may be provided with the plurality of test pins. Based on a quantity of regulation branches contained in the voltage regulation circuit, any test pins of the corresponding quantity can be selected to receive the test signal. On this basis, the voltage regulation module 103 can send test signals of the corresponding quantity based on the quantity of regulation branches contained in the voltage regulation circuit. For example, as shown in FIG. 5, if the voltage regulation circuit includes four regulation branches, any four test pins can be selected to receive test signals 1, 2, 3, and 4 respectively. These test signals can be used to control on/off of corresponding switch transistors, so as to control corresponding regulation resistors to be connected to or disconnected from the voltage regulation circuit. On this basis, the voltage regulation module 103 can control on/off of a corresponding switch transistor according to the test instruction carried in test signal 1, 2, 3, or 4, so as to control a corresponding regulation resistor to be connected to the voltage regulation circuit.

Referring to FIG. 8, in an embodiment, the chip test apparatus may further include a data strobe signal sending module 104. The data strobe signal sending module 104 may be configured to send a data strobe signal to the to-be-tested chip 100, and the data strobe signal may be used to trigger the data signal to be valid.

The chip test apparatus provided in the above embodiment can determine, by using the data strobe signal DQS, whether to receive the read data signal DQ0 to determine whether to execute an MRS instruction. For example, if the data signal DQ collected by using the data strobe signal DQS is at the low level, namely, DQ0, the MRS instruction is executed; if the data signal DQ collected by using the data strobe signal DQS is at the high level, namely, DQ1, the MRS instruction is not executed.

According to some embodiments, the present application further provides a computer device. The computer device can implement the steps of the chip test method according to any one of the above embodiments. Therefore, the computer device can also realize a technical effect that can be achieved by the chip test method.

Figure 9:
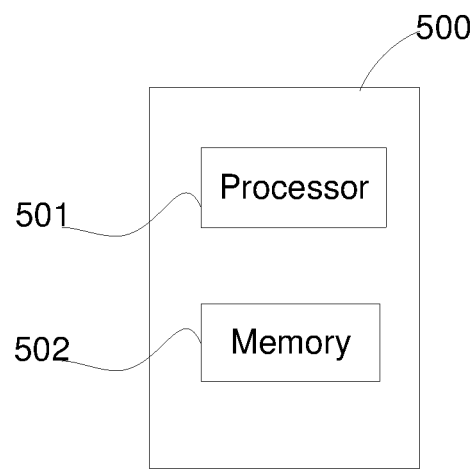
FIG. 9 is a schematic diagram of modules of an electronic equipment according to an embodiment of the present application.

An exemplary embodiment of the present disclosure provides a device for a chip test apparatus. Referring to FIG. 9, the device for the chip test apparatus 500 may be provided as a terminal device. The device for the chip test apparatus 500 may include a processor 501, and one or more processors may be set as required. The device for the chip test apparatus 500 may further include a memory 502 configured to store an executable instruction, such as an application program, of the processor 501. One or more memories may be set as required. The memory may store one or more application programs. The processor 501 is configured to execute the instruction to perform the foregoing method.

Persons skilled in the art should understand that the embodiments of the present disclosure may be provided as a method, an apparatus (device), or a computer program product. Therefore, the present disclosure may use a form of hardware only examples, software only examples, or examples with a combination of software and hardware. Moreover, the present disclosure may be in a form of a computer program product that is implemented on one or more computer-usable storage media that include computer-usable program code. The computer storage media include volatile and non-volatile, removable and non-removable media implemented in any method or technology for storing information (such as computer-readable instructions, data structures, program modules, or other data), including but not limited to, a RAM, a ROM, an EEPROM, a flash memory or other storage technologies, a CD-ROM, a digital versatile disk (DVD) or other optical disc storage, a magnetic cassette, a magnetic tape, magnetic disk storage or other magnetic storage apparatuses, or any other medium that can be used to store desired information and can be accessed by a computer. In addition, as is well known to persons of ordinary skill in the art, the communication media usually contain computer-readable instructions, data structures, program modules, or other data in modulated data signals such as carrier waves or other transmission mechanisms, and may include any information transfer medium.

In an exemplary embodiment, a non-transitory computer-readable storage medium including instructions is provided. Referring to FIG. 9, for example, the non-transitory computer-readable storage medium may be the memory 502 including instructions. The foregoing instructions may be executed by the processor 501 of the device for the chip test apparatus 500 to complete the foregoing method. For example, the non-transitory computer-readable storage medium may be a ROM, a RAM, a CD-ROM, a magnetic tape, a floppy disk, an optical data storage device, or the like.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or the another programmable device, thereby generating computer-implemented processing. Therefore, the instructions executed on the computer or the another programmable device provide steps for implementing a function specified in one or more processes in the flowcharts and/or in one or more blocks in the block diagrams.

According to some embodiments, the present application further provides a computer-readable storage medium. The computer-readable storage medium can implement the steps of the chip test method according to any one of the above embodiments. Therefore, the computer-readable storage medium can also realize a technical effect that can be achieved by the chip test method, and details are not described herein again.

It should be noted that the chip test method and the chip test apparatus in the embodiments of the present application can be applied to, but not limited to, the DRAM test field.

It should also be noted that the chip test apparatus in the embodiments of the present application can be configured to implement the corresponding chip test method. Therefore, the technical features of the method embodiment and the apparatus embodiment can be replaced and supplemented with each other when no conflict occurs, such that those skilled in the art can obtain the technical content of the present disclosure.

It should be understood that although steps in the flowcharts of FIG. 2, FIG. 4, and FIG. 6 are successively displayed according to the arrows, the steps are not necessarily executed in the order indicated by the arrows. The execution order of these steps is not strictly limited, and these steps may be executed in other orders, unless clearly described otherwise. Moreover, at least some of the steps in FIG. 2, FIG. 4, and FIG. 6 may include a plurality of sub-steps or stages. The sub-steps or stages are not necessarily executed at the same time, but may be executed at different times. The sub-steps or stages are not necessarily carried out sequentially, but may be executed alternately with other steps or at least some of sub-steps or stages of other steps.

The technical features of the foregoing embodiments can be employed in arbitrary combinations. To provide a concise description of these embodiments, all possible combinations of all technical features of the embodiments may not be described; however, these combinations of technical features should be construed as disclosed in the description as long as no contradiction occurs.

Only several implementations of the present disclosure are described in detail in the foregoing embodiments, but they should not therefore be construed as limiting the scope of the present application. It should be noted that those of ordinary skill in the art can further make variations and improvements without departing from the conception of the present application. These variations and improvements all fall within the protection scope of the present application. Therefore, the protection scope of the present application should be subject to the protection scope defined by the claims.

The invention claimed is:

1. A chip test method, comprising:
applying a test signal to a to-be-tested chip; and
sending a data signal to the to-be-tested chip such that the to-be-tested chip enters a test mode based on the test signal and the data signal, and regulating a test voltage of the to-be-tested chip;
wherein the to-be-tested chip is provided with a test mode register; and
when the to-be-tested chip is configured to be in an addressing mode, the sending a data signal to the to-be-tested chip such that the to-be-tested chip enters a test mode based on the test signal and the data signal, and regulating a test voltage of the to-be-tested chip comprises:
setting, by the test mode register based on the test signal, the to-be-tested chip to be in the test mode;
receiving, by the to-be-tested chip, the data signal after a preset period of time after receiving the test signal; and
after the data signal is maintained for a preset latch time, regulating the test voltage of the to-be-tested chip according to a test instruction carried in the test signal.

2. The chip test method according to claim 1, wherein the to-be-tested chip is provided with a test pin and a data pin; and
the to-be-tested chip receives the test signal by using the test pin, and receives the data signal by using the data pin.

3. The chip test method according to claim 1, wherein the applying a test signal to a to-be-tested chip comprises:
sending the test signal to a plurality of to-be-tested chips simultaneously, wherein the plurality of to-be-tested chips are located on a same to-be-tested wafer.

4. The chip test method according to claim 1, wherein the to-be-tested chip is provided with a receiving module; and
the sending a data signal to the to-be-tested chip such that the to-be-tested chip enters a test mode based on the test signal and the data signal comprises:
generating, by the receiving module, an internal test signal based on the test signal and the data signal; and
entering, by the to-be-tested chip, the test mode based on the internal test signal.

5. The chip test method according to claim 4, wherein the receiving module comprises an AND gate.

6. The chip test method according to claim 1, wherein the test instruction comprises a test voltage value; and
the regulating the test voltage of the to-be-tested chip according to a test instruction carried in the test signal comprises:
regulating an original voltage value of the to-be-tested chip to the test voltage value according to the test instruction carried in the test signal.

7. The chip test method according to claim 6, wherein the to-be-tested chip has a voltage regulation circuit, and the voltage regulation circuit comprises a plurality of load elements; and
the regulating an original voltage value of the to-be-tested chip to the test voltage value according to the test instruction carried in the test signal comprises:
regulating, by the to-be-tested chip, a quantity of the load elements connected to the voltage regulation circuit or a regulation frequency of the voltage regulation circuit based on the test voltage value.

8. The chip test method according to claim 1, wherein the preset period of time comprises a sum of an additive latency, a column address strobe (CAS) write latency, and a parity latency.

9. The chip test method according to claim 1, wherein the regulating the test voltage of the to-be-tested chip according to a test instruction carried in the test signal comprises:
sending a data strobe signal to the to-be-tested chip;
after receiving the data signal is maintained for the preset latch time, triggering, by using the data strobe signal, the data signal to be valid; and
regulating the test voltage of the to-be-tested chip according to the test instruction carried in the test signal.

10. The chip test method according to claim 9, wherein the preset latch time is a time during which the data strobe signal is transmitted for ½ of a burst length.

11. A non-transitory computer-readable storage medium, wherein the non-transitory computer-readable storage medium stores a computer program, and the computer program is executed by a processor to implement the chip test method according to claim 1.

* * * * *